(12) United States Patent
Burr (10) Patent No.: US 6,205,107 B1
(45) Date of Patent: Mar. 20, 2001

(54) ARCHITECTURES FOR HIGH-CAPACITY CONTENT-ADDRESSABLE HOLOGRAPHIC DATABASES

(75) Inventor: Geoffrey W. Burr, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/166,165

(22) Filed: Oct. 5, 1998

(51) Int. Cl.[7] ........................................................ G11B 7/00
(52) U.S. Cl. .............................................. 369/103; 369/112
(58) Field of Search .................................... 369/100, 103, 369/112, 120; 365/125

(56) References Cited

U.S. PATENT DOCUMENTS 5,319,629 * 6/1994 Henshaw et al. .

* cited by examiner

Primary Examiner—Paul W. Huber
(74) Attorney, Agent, or Firm—Thomas R. Berthold, Esq.; Banner & Witcoff, Ltd.

(57) ABSTRACT

An optical storage system that includes a spatial light modulator, a plurality of hologram storage volumes and a correlation-plane detector. The spatial light modulator, such as a liquid crystal modulator or a micromechanical reflection modulator, spatially modulates at least one first beam of light with information of an image to-be-stored. The plurality of hologram storage volumes receive the first beam of light and a second beam of light that is coherent with the first beam of light. Each hologram storage volume is formed from an optical storage medium, such as a photopolymer or a photorefractive crystal, and has at least one storage location for an image. Each first beam of light is directed to at least one selected storage location in at least one hologram storage volume. The second beam of light is directed to at least one selected storage location in at least one of the plurality of hologram storage volumes and passes through each hologram storage volume. The information of the image to-be-stored is recorded at a selected storage location of a selected hologram storage volume based on an intersection of the first beam of light and the second beam of light in the selected hologram storage volume. The second beam of light is focussed at at least a localized portion of the correlation plane of the correlation-plane detector after passing through the selected hologram storage volume.

60 Claims, 3 Drawing Sheets

ARCHITECTURES FOR HIGH-CAPACITY CONTENT-ADDRESSABLE HOLOGRAPHIC DATABASES

CROSS-REFERENCE TO RELATED APPLICATIONS

The present application is related to U.S. patent application Ser. No. 09/166,164 filed concurrently with the present application, and is incorporated by reference herein.

BACKGROUND OF THE INVENTION

1. Field of the Invention

The present invention relates to the field of optical memories. More particularly, the present invention relates to a method and a system for a content-addressable optical data storage system.

2. Description of the Related Art

Both precision and similarity searches are performed in many database applications. A precision search is an identification of all records in a database that exactly match a query argument. Typically, each record has a small number of dimensions, i.e., 5–20, that are defined with high resolution. A precision search is usually based on a combination of a few dimensions, and is desired to be relatively high speed. A similarity search is an identification of all records in a database that are similar to a query argument. For a similarity search, records typically have a large number of dimensions, i.e., 100–1000, that are defined with low resolution. A similarity search is usually based on most or all dimensions, with the degree of similarity as a desired output characteristic. Search speed is not necessarily an issue.

Algorithmic and optical correlation approaches have been developed for performing database searches. Algorithmic approaches exhibit a trade off between flexibility and speed by indexing responses to possible searches. Even though the search time through N records can be made less than O(N) for an algorithmic approach, the entire database must be re-indexed when a single record is added to the database.

Volume holography-based optical correlation has been proposed as a technique for searching for digital data that has been organized into a spatial pattern and then used as a template and query image. See, for example, B. J. Goertzen et al., Error-correcting code for volume holographic storage of a relational database, Optics Letters, 20(15), pp. 1655–1657, 1995. Holographic correlation is well-suited for searching databases that have records composed of fixed-length fields, but not for locating words at arbitrary locations within a page of text. Consequently, no serious demonstration of volume holography-based optical correlation has been shown.

A main focus for volume holography-based optical correlation thus far has been on forming smart-pixel arrays for detecting a patterned data page as readout by a reference beam. See, for example, B. J. Goertzen et al., Volume holographic storage for large relational databases, Optical Engineering, 35(7), pp. 1847–1853, 1995; R. D Snyder et al., Database filter: optoelectronic design and implementation, Applied Optics, 36(20), pp. 4881–4889, 1997; and K. G. Richling et al., Holographic storage and associative processing of analog and digital data, Proceedings of the 1997 IEEE LEOS Annual Meeting, pp. 132–133, 1997.

Optical correlation approaches using volume holography are based on a two-dimensional (2-D) cross-correlation between two images at a hardware level, such as disclosed by B. J. Goertzen et al., Volume holographic storage for large relational databases, Optical Engineering, 35(7), pp. 1847–1853, 1995. Lenses are used for performing a 2-D Fourier transform by implementing a convolution and correlation by Fourier transforming two images, multiplying the images, and then performing a second Fourier transform on the resulting product of the images. A hologram stores the Fourier transform of the first image in space as a multiplicand for the second image, and to shift the output angle of the correlation so that the correlation can be distinguished from the transmission of the second image.

A volume hologram is stored within a photosensitive material by interfering a desired information-carrying light beam, referred to as an object beam, with a reference beam to form a hologram of the desired information. The desired information or records are displayed on a pixellated input device, such as a Spatial Light Modulator (SLM), organized as spatial patterns forming "images" that are modulated onto an input laser beam to form the object beam. The object beam is then directed into a thick photosensitive storage material, such as a photorefractive crystal or a photopolymer. The reference light beam, which is coherent with the object beam, is also directed into the photosensitive storage material so that it interferes with the object beam. Several thousand holograms can be superimposed in the same volume of photosensitive storage material.

After storage, the respective reference beams for all the holograms that are superimposed in the volume of the photosensitive storage material can be reconstructed by illuminating the volume with a new object beam having a selected interrogating spatial pattern. The amount of light diffracted into each respective reference beam is a measure of the cross-correlation between the interrogating spatial pattern and the originally-stored pattern. Many cross-correlations can be output in parallel because as many as several thousand holograms can be superimposed in the same volume of photosensitive storage material.

An exemplary content-addressable optical data storage system is disclosed by U.S. Pat. No. 5,319,629 to Henshaw et al. The Henshaw et al. storage system includes a multi-dimensional optical storage medium that stores a plurality of holographic images representative of data. A search argument having a target data field is coupled into the optical storage medium for extracting a set of address fields at which data fields in the storage medium that match the target data field of the search argument are stored. The storage medium is a spectral hole burning (SHB) material having an address field that includes a wavelength address and a Bragg angle address. The wavelength address specifies a wavelength of light at which a particular data field is stored in the optical medium. The Bragg angle address specifies an angle of incidence of a reference light beam at which a particular data field is stored in the optical medium.

Optical correlation has also been used as a technique for pattern recognition for analog images, such as by detecting targets within a satellite photograph. The number of target templates that a real-time input image can be simultaneously compared against can be increased by multiplexing multiple volume holograms within a thick photosensitive storage material. Performance issues include signal detection within noise and clutter, such as non-target images in a satellite photograph, and image distortions, such as scale or rotation.

What is needed is a way in which many storage volumes can be interrogated simultaneously, thereby increasing the parallelism with which an optical data storage system can be searched. What is also needed is improved detection of optically-performed correlations that is robust in the presence of noise. Further still, what is needed is a way for performing similarity searches on holographically stored digital records.

SUMMARY OF THE INVENTION

The present invention provides two system architectures in which many storage volumes can be interrogated simultaneously, thereby increasing the parallelism with which an optical data storage system can be searched. The present invention also provides improved detection of optically-performed correlations that is robust in the presence of noise. Further still, the present invention provides a technique for performing similarity searches on holographically stored digital records.

The advantages of the present invention are provided by an optical storage system that includes a spatial light modulator, a plurality of hologram storage volumes and a correlation-plane detector. The spatial light modulator, such as a liquid crystal modulator or a micromechanical reflection modulator, spatially modulates at least one first beam of light with information of an image to-be-stored. The plurality of hologram storage volumes receive the first beam of light and a second beam of light that is coherent with the first beam of light. Each hologram storage volume is formed from an optical storage medium, such as a photopolymer or a photorefractive crystal, and has at least one storage location for an image. Each first beam of light is directed to at least one selected storage location in at least one hologram storage volume. The second beam of light is directed to at least one selected storage location in at least one of the plurality of hologram storage volumes and passes through each hologram storage volume. The information of the image to-be-stored is recorded at a selected storage location of a selected hologram storage volume based on an intersection of the first beam of light and the second beam of light in the selected hologram storage volume. The second beam of light is focussed at at least a localized portion of the correlation plane of the correlation-plane detector after passing through the selected hologram storage volume.

According to the invention, the first beam of light can pass through at least one hologram storage volume or, alternatively, can be split into a plurality of first beams of light by an object beam splitter, in which case each first beam of light corresponds to at least one hologram storage volume. Further, the spatial light modulator modulates each of the plurality of first beams of light with the information of the image to-be-stored.

Optical correlation can be performed by the optical storage system by the spatial light modulator modulating at least one third beam of light with information of an image to-be-correlated. Each third beam of light is directed to a selected storage location in at least one hologram storage volume and thereby generates a diffraction beam that is focussed at at least a localized portion of the correlation plane of the correlation-plane detector. The correlation-plane detector then detects at least one reconstructed correlation peak at the correlation plane. A correlation score is tabulated for each image stored in the plurality of hologram storage volumes based on the detected reconstructed correlation peak from one or more closely-spaced localized regions of the correlation-plane detector.

BRIEF DESCRIPTION OF THE DRAWING

The present invention is illustrated by way of example and is not limited by the accompanying figures in which like reference numerals indicate similar elements and in which.

DETAILED DESCRIPTION

The present invention provides a content-addressable optical data storage system in which the number of holograms that are simultaneously illuminated is significantly increased over conventional content-addressable optical data storage systems. The present invention also provides several techniques for improving data discrimination and signal-to-noise ratio for optical correlation for a content-addressable optical data storage system. Further, the present invention provides a technique for similarity searching a content-addressable optical data storage system.

According to one aspect of the present invention, two distinct storage system architectures are provided for increasing the number of storage volumes, or blocks of storage material, containing multiplexed holograms that are simultaneously illuminated by a querying object beam. The number of holograms that are multiplexed at any one location in the storage material is not increased based on the limited dynamic range of each hologram. That is, the diffraction efficiency of each hologram scales as the reciprocal of the number of superimposed holograms squared.

The first architecture provided by the present invention increases the number of hologram storage volumes along the object beam path. Hologram storage volumes are organized to be one behind another along the path of the object beam so that the significant portion of the object beam that passes through a storage volume without diffraction becomes an input object beam for the subsequent hologram storage volume. Preferably, a single long rod of storage material (several centimeters long) is used that has side faces that are capable of total internal reflection so that the object beam is kept confined. Additionally, the storage material must preferably have a low absorption, that is, highly transmissive, and is highly sensitivity at the wavelength of light used for reading and for querying the database, such as a permanent storage material that bleached during recording, or two-color gated recording in photorefractives. Alternatively, a plurality of separate blocks of storage material for each hologram storage volume can be used. With the latter approach, lenses may be required for keeping the information-bearing object beam confined to a small cross-section.

The second architecture provided by the present invention splits the object beam into a number of paths by illuminating a spatial light modulator (SLM) with a plurality of incident beams, or by passing an object beam through a diffractive optical element before and after a spatial light modulator. The laser power is split and used only once for each block of storage material so there is a corresponding decrease in power associated with each object beam path at the correlation plane during recording. One solution for addressing the corresponding decrease in power is by configuring the optical data storage system so that all the optical power is concentrated in one path during a recording operation, but split uniformly among all paths during a readout operation.

By providing simultaneously illuminated a plurality of holograms, the present invention can be used for general optical correlation tasks, including multichannel recognition of analog images because the ability to have a large number of templates provides the possibility for feature identification, rotational and scale invariance, and multiple target classes. Further, an optical data storage system according to the present invention need not be entirely stationary. Multiple illuminated storage locations can be distributed throughout a selected region of a rotating disk, for example, so that a laser pulse accesses more than one location at a time. As the disk rotates, subsequent laser pulses access different set of locations at correspondingly different selected region of the disk.

Figure 1:
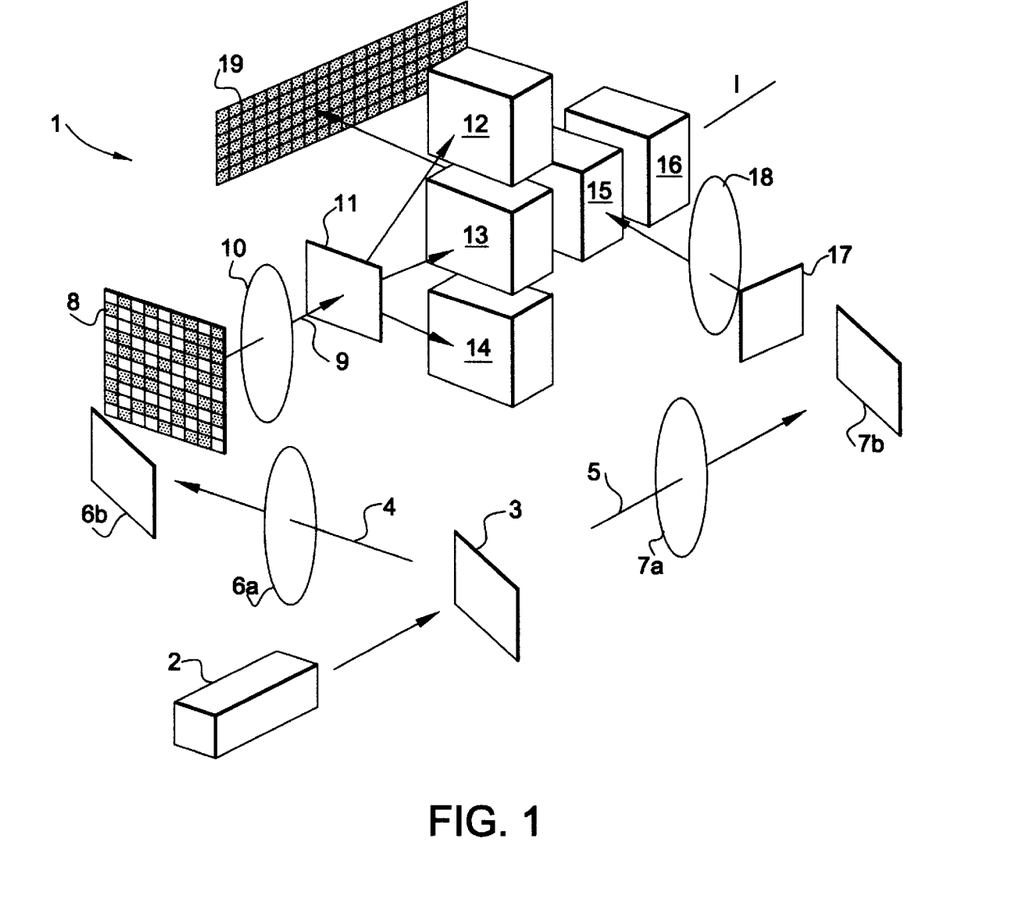
FIG. 1 shows a preferred arrangement of a high-capacity holographic content-addressable data storage system according to the present invention.

FIG. 1 shows a preferred arrangement of a high-capacity holographic content-addressable data storage system 1 according to the present invention. Coherent light from a laser 2, such as a diode laser, is split by a beamsplitter 3 into two beams 4 and 5 that respectively become an object beam and a reference beam. Beams 4 and 5 are then respectively collimated and routed by optics 6a, 7a and mirrors 6b, 7b.

Beam 4 is routed through a spatial light modulator (SLM) 8, which is a two-dimensional array of pixels capable of blocking or passing light. Preferably, SLM 8 is a reflection-type or a transmission type liquid-crystal device (LCD). Alternatively, SLM 8 can be a micromechanical reflection modulator. SLM 8 includes a plurality of individual elements that each have a first state that allows coherent light pass through SLM 8, and a second state in which a minimum amount of coherent light passes through SLM 8. The data that is to-be-stored is arranged into patterns on SLM 8 so that beam 4 passes through SLM 8 and becomes an object beam 9. Alternatively, SLM 8 and generation of the coherent light beams can be within the same device.

Object beam 9 is focussed by a lens 10 through a beam-splitting element 11 into hologram storage volumes 12, 13 and 14, each formed from an optical storage material, such as a photorefractive crystal, a photopolymer or a spectral hole burning (SHB) material, so that identical copies of the data imaged from SLM 8 are conveyed to different locations in storage material 12, 13 and 14. When a photorefractive crystal is used, the crystal is made photosensitive to recording light by pre-exposing or simultaneously exposing the crystal in a well-known manner with gating light having a different wavelength or polarization than that of the recording light. Object beam 9 passes through the different locations in storage material 13 to additional locations (15, 16) located behind ("downstream") storage material 13.

Reference beam 5 passes through a beam-steering element 17 and lens(es) 18 that direct reference beam 5 to one (or more) of the storage locations in storage materials 12–16. In the preferred embodiment of the present invention, reference beam 5 enters the hologram storage volumes 13, 15 and 16 perpendicularly to a longitudinal axis 1 through hologram storage volumes 13, 15 and 16. Lens(es) 18 focus reference beam 5 onto a correlation-plane detector array (CDA) 19. Lens(es) 18 can be located along the reference beam path either before or after the optical storage material. Once the interference fringes formed by the two coherent beams are preserved in the photosensitive material, the reference beam 5 is blocked and a set of search data is arrayed onto SLM 8. The beam modulated by the search data information is simultaneously projected into all of hologram storage volumes 12–16 for reconstructing a set of output reference beams. Preferably, the optics used to store reference beam 5 allow the reconstructed beams to come to focus on correlation detector array (CDA) 19 without any intervening optics.

The present invention provides several techniques for providing improved discrimination and signal-to-noise ratio for optical correlation for a content-addressable optical data storage system, such as using a modified reference beam, by a selected organization of data patterns during storage and during database interrogation, by using shift invariance, and by conditioning received signals.

Figure 2:
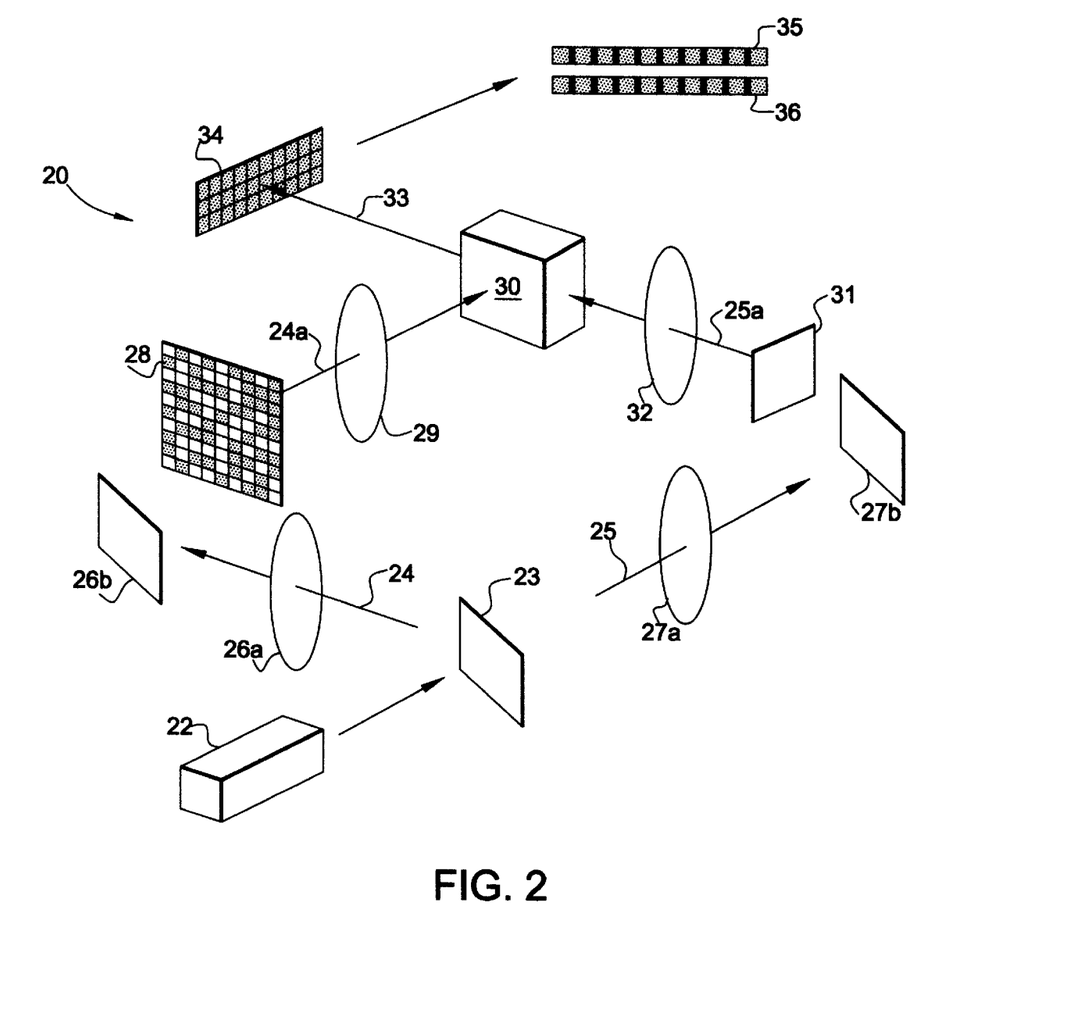
FIG. 2 shows an arrangement of a holographic content-addressable data storage system having improved discrimination and signal-to-noise ratio for optical correlation according to the present invention.

FIG. 2 shows an arrangement of a holographic content-addressable data storage system 20 according to the present invention having improved discrimination and signal-to-noise ratio for optical correlations. Coherent light from a laser 22, such as a diode laser, is split by a beamsplitter 23 into two beams 24 and 25 that respectively become an object beam and a reference beam. Beams 24 and 25 are then respectively collimated and routed by optics 26a, 27a and mirrors 26b, 27b.

Beam 24 is routed through a Spatial Light Modulator (SLM) 28, which is a two-dimensional array of pixels capable of blocking or passing light, and modulating the phase of the light passing through each pixel. Preferably, SLM 28 is a reflection-type or a transmission type LCD device. Alternatively, SLM 28 can be a micromechanical reflection modulator. The data that is to-be-stored is arranged into patterns on SLM 28 so that beam 24 passes through SLM 28 and becomes an object beam 24a. Object beam 24a is then focussed by a lens 29 into a hologram storage volume 30 formed from an optical storage material, such as a photopolymer, a photorefractive crystal or a spectral hole burning (SHB) material.

Reference beam 25 passes through a diffractive optical element 31 that modulates beam 25 forming a reference beam 25a that has a uniquely-modified spatial frequency spectrum with respect to other reference beams used for recording images in the optical storage material. Modulated reference beam 25a is directed by beam-steering optics 32 into optical storage material 30 to form an interference pattern with object beam 24a that is recorded in hologram storage volume 30.

Preferably, diffractive optical element 31 is a low-frequency grating, such as a phase grating, 1-D Dammann grating, or other similar diffractive optical element, that changes the Fourier spectrum of beam 25a from one focussed spot at a correlation plane to a plurality of vertically-spaced focussed spots at the correlation plane that can be uniquely identified in the presence of noise. Preferably, modified reference beam 25a is formed from several plane waves that differ slightly in vertical incidence angle. Additionally, the reference beam path contains a lens (not shown) positioned either before or after hologram storage volume 30 so that a large planewave reference beam is focussed to a localized region of a correlation detector array 34. Correlation detector array 34 generates a correlation signal that is based on a summation over several slightly separated pixel regions minus the optical signal falling on the pixels in between the regions. In an idealized system, the correlation peak(s) that appear at the correlation plane for an exact match between the stored and query images is (are) then simply the Fourier transform of the reference beam.

Shift invariance makes it possible for one of the correlation peaks of a hologram to potentially adversely shift into a region of the correlation plane that is associated with another hologram. Consequently, erroneous matches can occur unless the two correlation peaks are distinct. To avoid this, the present invention imparts different spatial frequency modulations to the reference beams used for storing different holograms that have correlation peaks that are displaced vertically by diffractive optical element 31 so that a true match to a query image can be distinguished from a shifted match of another hologram.

Once the interference fringes formed by the two coherent beams 24a and 25a are preserved in the photosensitive material of hologram storage volume 30, reference beam 25 is blocked and a set of search data is arrayed onto SLM 28. The beam modulated by the search data arrayed on SLM 28 is projected into hologram storage volume 30 and reconstructs a set of output reference beams 33. Preferably, optics 32 used to store the reference beam allows reconstructed beams 33 to be focussed on correlation detector array 34 without any intervening optics.

After holograms are stored, but before searching, storage system 20 is calibrated for reducing the effects of variations in diffraction efficiency from hologram to hologram and for reducing "dark" signal level effects. Hologram-to-hologram variations in diffraction efficiency become a noise source because the correlation peaks for many holograms are thresholded together. The dark signal level adversely affects optical correlation by consuming part of the dynamic range of the correlation detector. Additionally, variations of the dark signal level caused by the number and position of ON pixels in each hologram adversely affect optical correlation.

According to the invention, a bias signal and a background signal are measured for each bin of correlation detector array 34. Thus, a signal received by correlation detector array 34 can be conditioned by biasing based on hologram strength and/or by subtracting a dark signal level from the received signal. The bias values for each bin of correlation detector array 34 are measured by interrogating stored holograms with a special interrogating pattern that is preferably a small gauging block that all the stored holograms share in common, and is preferably an all-ON page pattern. The measured bias level data for each correlation bin is stored in electronic form in a shift register, or an array 35 and used during normal detection. The effect of the variations are reduced by scaling the received signal values by the individual bias level data for each hologram.

As with the bias level data, the dark signal level is also measured by the present invention on a hologram-by-hologram basis by illuminating each stored hologram with a special interrogating pattern that is preferably an all-OFF pattern. The measured dark signal level data for each correlation bin is stored in electronic form in a shift register or an array 36, and used during normal detection as background level data.

Figure 3:
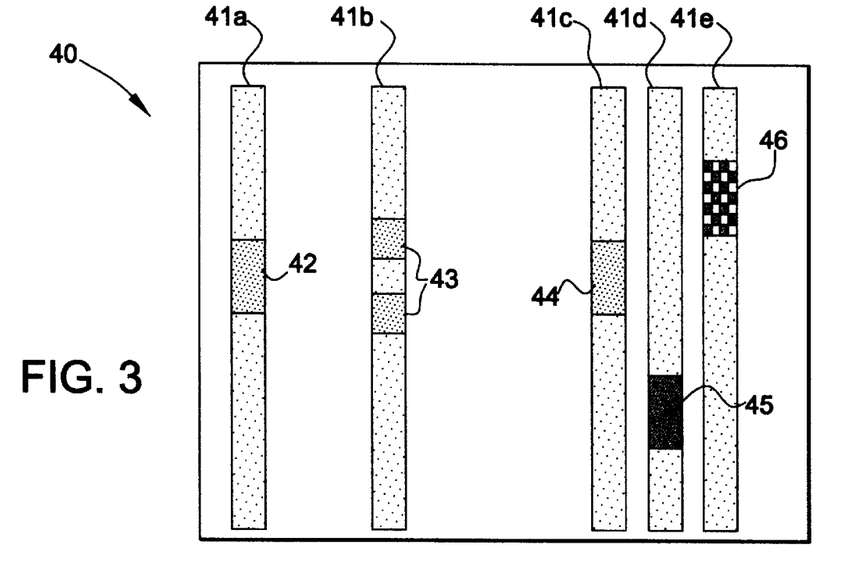
FIG. 3 shows an arrangement of exemplary spatial patterns displayed on a spatial light modulator.

Yet another technique provided by the present invention for providing improved discrimination and signal-to-noise ratio for optical correlation is by using a selected organization of data patterns during storage and during database interrogation, such as a slider bar, pixel grey-level weighting, and pixel phase modulation. FIG. 3 shows an arrangement 40 of exemplary spatial patterns displayed on a spatial light modulator. An image displayed on the spatial light modulator is arranged into regions 41a–41e that correspond to the fixed-length fields of the database that is stored optical storage system 20. The position of a block of ON pixels 42 within a region, such as region 41a, encodes a desired data value.

A slider bar, or track, is a pixellated pattern of data that is displayed by a spatial light modulator along an organized path according to a desired ordinality of the data that can be used during recording and during a similarity search. A preferred ordinality of data is a vertical column or track of pixels in which the position of the block of pixels that are turned ON within the column indicates the data value being stored or being searched for. According to the invention, the column of pixels is not necessarily vertical, but should be orthogonal to the interaction plane formed by the central reference and object beams.

The choice of the size or height of the slider within a track, both during storage and during interrogation, is a tradeoff between a search range (degree of similarity) and a signal strength of a resulting correlation peak. For example, consider a record containing the value "83%" encoded by a rectangular block having a height of 10 pixels within a slider track of 100 pixels so that the "83%" record is a rectangular block extending from pixel 78 to 88 of the slider track. When searching for records exactly matching the encoded value of "83%", an interrogating spatial pattern having a small block of 10 pixels centered at pixel 83 of the slider track generates a strong correlation response from the record encoding "83%". Another record encoding the value "79%", however, also generates a correlation response, albeit a slightly smaller, because the overlap between the record encoding "79%" (pixels 74 to 84) and the search block (pixels 78 to 88) is only 6 pixels, as opposed to the overlap of 10 pixels for a record encoding "83%". An exact search for a record encoding the value "83%" would discard a record encoding a value of "79%" as well as a record encoding the value of, for example, "22%" as equally undesirable.

Thus, the slider bars of the present invention enable fuzzy, or similarity, searching. That is, records that partially match an interrogating spatial pattern generate a correlation response that is scaled by the degree to which records match the interrogating spatial pattern. An extremely broad, or fuzzy, search can be performed using the sliders of the present invention by increasing the height of the search bar to generate correlation responses, for example, for any record encoding a value in the range of "60%" to "100%". Accordingly, dynamic adjustment of a search range can be achieved without erasing and re-recording holograms. During readout, blocks may be shifted slightly, as shown at 43 in FIG. 4, so that vertical shift invariance creates a unique pattern of readout correlation peaks that can be detected in the presence of noise or background signal.

When simultaneously searching several fields, such as fields 41c–41e, responses may be weighted relative to each other by a change in transmission, or gray level, in the pixels of the spatial light modulator, as shown at 44 and 45 in FIG. 3, or by selective reduction in the number of ON pixels within a desired block, referred to herein as dithering, as shown at 46. The various data patterns displayed during interrogation (or during storage) can be weighted in terms of relative importance by using a gray-level response in the pixels of the spatial light modulator. Pixel brightnesses in a stored image can also be decreased by reducing a temporal exposure during recording.

Figure 4:
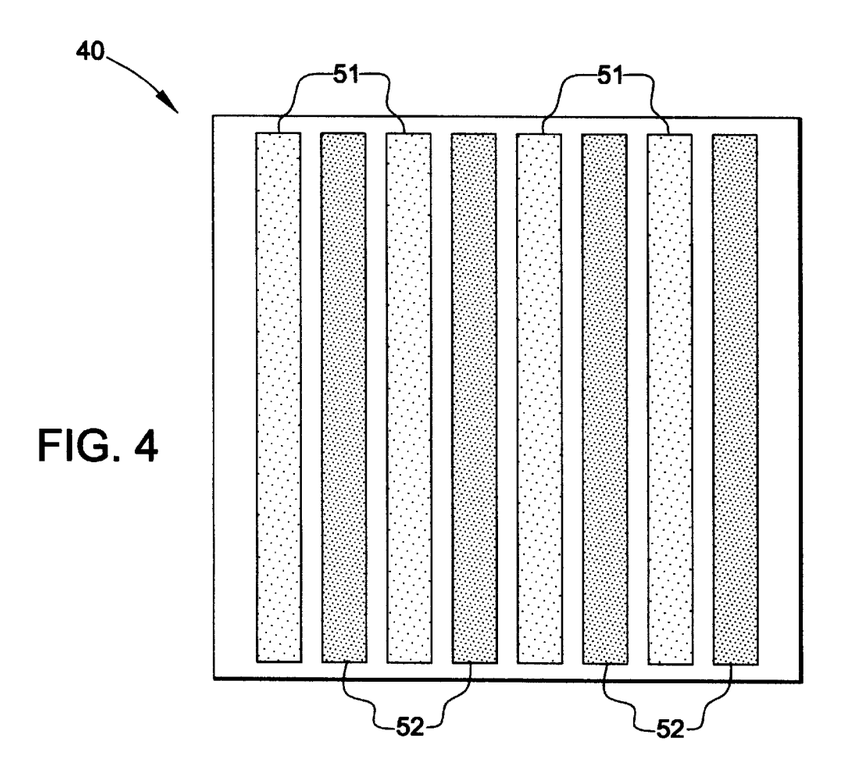
FIG. 4 shows an exemplary periodic arrangement of phase for a spatial pattern displayed on a spatial light modulator.

Phase modulation of the reference beam by displaying multiple phase levels on the spatial light modulator can be used for suppressing a cross-correlation and for reduction of dark current. The control over the phase of each pixel requires slight modification of the polarization input to the spatial light modulator in a well-known manner, and placement of the output polarizer at a tilted angle, also in a well-known manner. FIG. 4 shows an exemplary periodic arrangement 50 of phase for a spatial pattern displayed on a spatial light modulator. The phase of the pixels used within each region can be varied across the page of the spatial light modulator. In this way, the undesired background signal arising from not-completely-OFF pixels of a finite contrast spatial light modulator is reduced by destructive interference. Preferably, ON pixels within a subset of the regions 51 within the page always take the value +1 (0 phase), while the ON pixels within all other regions 52 always take the value −1 (π phase).

Imperfect contrast in the spatial light modulator causes a small amount of light to be input into the storage medium from pixels that are nominally OFF, both as an interrogating spatial pattern or as a stored data pattern. Consequently, in addition to the desired signal, there will be undesired background signal caused by ON-OFF and OFF-OFF combinations of the pixels of the interrogating search pattern and the stored data pages. The desired signal is generated by, for example, ON pixels in an interrogating spatial pattern matching ON pixels in stored data pages. The undesired background signal is generated by, for example, an ON pixel in an interrogating search pattern correlating with a weak hologram of an OFF pixel in a stored page (or vice versa, an OFF pixel in an interrogating search pattern reading a strong hologram from an ON pixel in a stored page), or an OFF-OFF pixel combination. Each undesired contribution diffracts only a small amount of light towards the correlation plane, but the sum effect over thousands of pixels creates a sizable "dark" signal that is effectively a deterministic noise source.

According to the invention, the dark signal noise source can be reduced by phase modulating the spatial light modulator during data storage so that each field or slider track has an associated constant phase value. The phase value is alternated across the display so that the DC level of the dark signal is zero. For example, odd columns of the spatial light modulator are selected to always have negative phase, while even columns are selected to always have a positive phase. Interrogating signals add up as desired (a negative input reads out a negative block, positive input reads a positive block), but the undesired ON-OFF dark signal is suppressed. To suppress the dark signal caused by OFF-OFF pixel combinations, the phase of the OFF pixels can also be spatially modulated, either during storage or searching, but not both, so that the contribution to the dark signal by OFF-OFF pixel combinations tends to cancel by destructive interference.

For exact searches on data fields that are composed of multiple blocks, such as a byte of data composed of 8 blocks with each block representing a bit, the ratio between auto-correlation and undesired cross-correlations, for example, when 7 bits match, but 1 bit differs, can be increased by using both positive and negative phase values within the blocks.

By interrogating stored patterns with a slightly shifted version, a correlation peak can be moved to be within a correlation plane. That is, by illuminating a stored pattern with a closely related, but not identical interrogating pattern, the shift invariance can be exploited to create a unique distribution of correlation peaks at a location near the auto-correlation peak. Preferably, a block located within a slider track is identified by interrogating with two blocks: one above and one below the first block within the slider track. Matches are identified by two slightly-spaced peaks straddling the nominal correlation peak position within the correlation plane.

Implementation of the shift invariance is based on the organization of search data so that a set of closely-spaced multiple correlation peaks are generated at the correlation plane. A similar modified metric can be used for generating an appropriate correlation score, to which several regions of the correlation plane affirmatively contribute. Any detected light in the regions in between the regions can be used for reducing the correlation score.

While the present invention has been described in connection with the illustrated embodiments, it will be appreciated and understood that modifications may be made without departing from the true spirit and scope of the invention.

What is claimed is:

1. A method for storing an image in an optical storage system, the method comprising the steps of:
   spatially modulating at least one first beam of light with information of an image to-be-stored, each respective first beam of light corresponding to at least one hologram storage volume of a plurality of hologram storage volumes, each hologram storage volume being formed from an optical storage medium and storing a plurality of images;
   directing each respective first beam of light to a storage location in each hologram storage volume corresponding to the first beam of light;
   directing a second beam of light to at least one selected storage location in the plurality of hologram storage volumes, the second beam of light being coherent with the first beam of light and being focussed at at least a localized portion of a correlation plane; and
   recording the information of the image to-be-stored in the optical storage medium at each selected storage location based on an intersection of the first beam of light and the second beam of light in the hologram storage volume containing each selected storage location.

2. The method according to claim 1, further comprising the step of splitting the first beam of light into a plurality of first beams of light.

3. The method according to claim 2, wherein the step of modulating the at least one first beam of light includes modulating each first beam of light with the information of the image to-be-stored after the step of splitting the first beam of light.

4. The method according to claim 1, wherein the step of directing each respective first beam of light to a storage location in each hologram storage volume corresponding to the first beam of light includes the step of passing at least one first beam of light through at least one hologram storage volume.

5. The method according to claim 1, wherein the second beam of light enters a hologram storage volume perpendicularly to a longitudinal axis of the hologram storage volume.

6. The method according to claim 1, wherein the step of modulating the first beam of light with information of the image to-be-stored uses a spatial light modulator for modulating the first beam of light.

7. The method according to claim 6, wherein the spatial light modulator is a liquid crystal modulator.

8. The method according to claim 6, wherein the spatial light modulator is a micromechanical reflection modulator.

9. The method according to claim 1, wherein the optical storage medium is a photopolymer.

10. The method according to claim 1, wherein the optical storage medium is a photorefractive crystal.

11. The method according to claim 10, the method further comprising the step of exposing the photorefractive crystal with gating light having a wavelength that is different from a wavelength of the first beam of light.

12. The method according to claim 10, the method further comprising the step of exposing the photorefractive crystal with gating light having a polarization that is different from a polarization of the first beam of light.

13. The method according to claim 10, the method further comprising the step of simultaneously exposing the photorefractive crystal with gating light having a wavelength that is different from the wavelength of the first beam of light when the first beam of light is directed to the storage location in each hologram storage volume corresponding to the first beam of light.

14. The method according to claim 10, the method further comprising the step of simultaneously exposing the photorefractive crystal with gating light having a polarization that is different from the polarization of the first beam of light when the first beam of light is directed to the storage location in each hologram storage volume corresponding to the first beam of light.

15. The method according to claim 1, wherein the first and second beams of light are generated by a diode laser.

16. The method according to claim 1, further comprising the steps of:
   modulating a third beam of light with information of an image to-be-correlated;
   splitting the third beam of light into a plurality of third beams of light, each third beam of light corresponding to at least one hologram storage volume of the plurality of hologram storage volumes;
   directing each respective third beam of light to a storage location in each respective hologram storage volume corresponding to the third beam of light; and
   detecting at least one reconstructed correlation peak at the correlation plane.

17. The method according to claim 16, wherein the step of detecting the at least one reconstructed correlation peak is performed by a correlation-plane detector.

18. The method according to claim 16, further comprising the step of tabulating a correlation score for each image stored in the plurality of hologram storage volumes based on the detected reconstructed correlation peak from one or more closely-spaced localized regions of the correlation-plane detector.

19. The method according to claim 16, wherein the step of modulating the third beam of light with information of the image to-be-correlated uses a spatial light modulator for modulating the third beam of light.

20. The method according to claim 16, wherein the step of directing each respective first beam of light to a storage location in each hologram storage volume corresponding to the first beam of light includes the step of passing at least one first beam of light through at least one hologram storage volume.

21. A method for optical correlation, the method comprising the steps of:
   modulating a first beam of light with information of an image to-be-correlated;
   splitting the first beam of light into a plurality of first beams of light, each first beam of light corresponding to at least one hologram storage volume of a plurality of hologram storage volumes, each hologram storage volume being formed from an optical storage medium and storing a plurality of images;
   directing each respective first beam of light to a storage location in each respective hologram storage volume corresponding to the first beam of light; and
   detecting at least one reconstructed correlation peak at the correlation plane.

22. The method according to claim 21, wherein the step of detecting the at least one reconstructed correlation peak is performed by a correlation-plane detector.

23. The method according to claim 21, further comprising the step of tabulating a correlation score for each image stored in the plurality of hologram storage volumes based on the detected reconstructed correlation peak from one or more closely-spaced localized regions of the correlation-plane detector.

24. The method according to claim 21, wherein the step of directing each respective first beam of light to a storage location in each hologram storage volume corresponding to the first beam of light includes the step of passing at least one first beam of light through at least one hologram storage volume.

25. The method according to claim 21, wherein the step of modulating the first beam of light with information of the image to-be-correlated uses a spatial light modulator for modulating the first beam of light.

26. The method according to claim 25, wherein the spatial light modulator is a liquid crystal modulator.

27. The method according to claim 25, wherein the spatial light modulator is a micromechanical reflection modulator.

28. The method according to claim 21, wherein the optical storage medium is a photopolymer.

29. The method according to claim 21, wherein the optical storage medium is a photorefractive crystal.

30. An optical storage system, comprising:
   a spatial light modulator modulating at least one first beam of light with information of an image to-be-stored;
   a plurality of hologram storage volumes, each hologram storage volume being formed from an optical storage medium and having at least one storage location for an image, the plurality of hologram storage volumes receiving the first beam of light and a second beam of light, the second beam of light being coherent with the first beam of light, each first beam of light being directed to at least one selected storage location in at least one hologram storage volume, the second beam of light being directed to at least one selected storage location in at least one of the plurality of hologram storage volumes and passing through each hologram storage volume, the information of the image to-be-stored being recorded at a selected storage location of a selected hologram storage volume based on an intersection of the first beam of light and the second beam of light in the selected hologram storage volume; and
   a correlation-plane detector on which the second beam of light is focussed at at least a localized portion of a correlation plane of the correlation-plane detector after passing through the selected hologram storage volume.

31. The optical storage system according to claim 30, wherein at least one first beam of light passes through at least one hologram storage volume.

32. The optical storage system according to claim 30, further comprising an object beam splitter splitting the first beam of light into a plurality of first beams of light, each first beam of light corresponding to at least one hologram storage volume.

33. The optical storage system according to claim 32, wherein the spatial light modulator modulates each of the plurality of first beams of light with the information of the image to-be-stored.

34. The optical storage system according to claim 30, wherein the spatial light modulator is a liquid crystal modulator.

35. The optical storage system according to claim 30, wherein the spatial light modulator is a micromechanical reflection modulator.

36. The optical storage system according to claim 30, wherein the optical storage medium is a photopolymer.

37. The optical storage system according to claim 30, wherein the optical storage medium is a photorefractive crystal.

38. The optical storage system according to claim 37, wherein the photorefractive crystal is exposed with gating light having a wavelength that is different from a wavelength of the first beam of light.

39. The optical storage system according to claim 37, wherein the photorefractive crystal is exposed with gating light having a polarization that is different from a polarization of the first beam of light.

40. The optical storage system according to claim 37, wherein the photorefractive crystal is exposed simultaneously with gating light having a wavelength that is different from the wavelength of the first beam of light when the first beam of light is directed to the plurality of hologram storage volumes.

41. The optical storage system according to claim 37, wherein the photorefractive crystal is exposed simultaneously with gating light having a polarization that is different from the polarization of the first beam of light when the first beam of light is directed to the plurality of hologram storage volumes.

42. The optical storage system according to claim 37, further comprising a beam splitter splitting a coherent light beam into the first and second beams of light.

43. The optical storage system according to claim 42, further comprising a light generator generating the coherent light beam.

44. The optical storage system according to claim 43, wherein the light generator is a diode laser.

45. The optical storage system according to claim 30, wherein the spatial light modulator modulates at least one third beam of light with information of an image to-be-correlated, each third beam of light being directed to a selected storage location in at least one hologram storage volume and thereby generating a diffraction beam that is focussed at at least a localized portion of the correlation plane of the correlation-plane detector, and wherein the correlation-plane detector detects at least one reconstructed correlation peak at the correlation plane.

46. The optical storage system according to claim 45, a correlation score is tabulated for each image stored in the plurality of hologram storage volumes based on the detected reconstructed correlation peak from one or more closely-spaced localized regions of the correlation-plane detector.

47. The optical storage system according to claim 45, wherein the third beam of light passes through at least one hologram storage volume.

48. The optical storage system according to claim 45, further comprising an object beam splitter splitting the third beam of light into a plurality of third beams of light, each third beam of light corresponding to a hologram storage volume.

49. The optical storage system according to claim 45, wherein the spatial light modulator is a liquid crystal modulator.

50. The optical storage system according to claim 45, wherein the spatial light modulator is a micromechanical reflection modulator.

51. The optical storage system according to claim 45, wherein the optical storage medium is a photopolymer.

52. The optical storage system according to claim 45, wherein the optical storage medium is a photorefractive crystal.

53. An optical correlation system, comprising:

a plurality of hologram storage volumes, each hologram storage volume being formed from an optical storage medium and each having at least one storage location for an image, a spatial light modulator modulating a first beam of light with information of an image to-be-correlated, each first beam of light being directed to a selected storage location in at least one hologram storage volume and thereby generating a diffraction beam; and a correlation-plane detector on which the diffraction beam of light is focussed at at least a localized portion of a correlation plane of the correlation-plane detector, the correlation-plane detector detecting at least one reconstructed correlation peak at the correlation plane.

54. The optical correlation system according to claim 53, wherein the first beam of light passes through at least one hologram storage volume.

55. The optical correlation system according to claim 53, further comprising an object beam splitter splitting the first beam of light into a plurality of first beams of light, each first beam of light corresponding to a hologram storage volume.

56. The optical correlation system according to claim 53, a correlation score is tabulated for each image stored in the plurality of hologram storage volumes based on the detected reconstructed correlation peak from one or more closely-spaced localized regions of the correlation-plane detector.

57. The optical correlation system according to claim 53, wherein the spatial light modulator is a liquid crystal modulator.

58. The optical correlation system according to claim 53, wherein the spatial light modulator is a micromechanical reflection modulator.

59. The optical correlation system according to claim 53, wherein the optical storage medium is a photopolymer.

60. The optical correlation system according to claim 53, wherein the optical storage medium is a photorefractive crystal.

* * * * *